US012787183B2

(12) United States Patent
Watai

(10) Patent No.: US 12,787,183 B2
(45) Date of Patent: Nov. 3, 2026

(54) ELECTRONIC DEVICE

(71) Applicant: Mitsubishi Electric Corporation, Tokyo (JP)

(72) Inventor: Atsuki Watai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 81 days.

(21) Appl. No.: 18/877,619

(22) PCT Filed: Jul. 26, 2022

(86) PCT No.: PCT/JP2022/028824
§ 371 (c)(1),
(2) Date: Dec. 20, 2024

(87) PCT Pub. No.: WO2024/023939
PCT Pub. Date: Feb. 1, 2024

(65) Prior Publication Data

US 2026/0262174 A1 Sep. 3, 2026

(51) Int. Cl.
*H05K 5/02* (2006.01)
*H02H 7/122* (2006.01)
(Continued)

(52) U.S. Cl.
CPC ........... *H05K 5/0208* (2013.01); *H02H 7/122* (2013.01); *H02H 7/16* (2013.01); *H02M 3/003* (2021.05); *H05K 5/03* (2013.01)

(58) Field of Classification Search
CPC combination set(s) only.
See application file for complete search history.

(56) References Cited

U.S. PATENT DOCUMENTS 3,412,309 A * 11/1968 Boonstra ........... H02M 7/53854 363/57
6,198,040 B1 * 3/2001 Desousa .................. H02G 3/14 174/375
(Continued)

FOREIGN PATENT DOCUMENTS

JP H0476530 B2 7/1992
JP 2003052179 A 2/2003
(Continued)

OTHER PUBLICATIONS

First Office Action dated Nov. 21, 2025, issued in the corresponding Chinese Patent Application No. 202290000953.6, 5 pages including 3 pages of Partial English Translation.
(Continued)

*Primary Examiner* — Lisa Lea-Edmonds
(74) *Attorney, Agent, or Firm* — Buchanan Ingersoll & Rooney PC

(57) ABSTRACT

An electronic device includes a housing having a first opening and accommodating an electronic component and a discharge resistor, a discharge switch, a first cover being openable/closable and covering the first opening, and a displacement limiting member. The discharge switch includes a pair of terminals and a movable member made of a conductor and positioned in a conductive position or non-conductive position. The displacement limiting member allows the movable member to be positioned in the conductive position when the first cover is opened, and maintains the movable member in the non-conductive position when the first cover is closed. When the movable member positioned in the conductive position, the electronic component is electrically connected to the discharge resistor, and when the movable member is positioned in the non-conductive
(Continued)

position, the electronic component is electrically disconnected from the discharge resistor.

20 Claims, 14 Drawing Sheets

(51) Int. Cl.
*H02H 7/16* (2006.01)
*H02M 3/00* (2006.01)
*H05K 5/03* (2006.01)

(56) References Cited

U.S. PATENT DOCUMENTS

| | | | | |
|---|---|---|---|---|
| 10,086,847 | B2 * | 10/2018 | Ikemoto | B61C 17/00 |
| 10,499,514 | B2 * | 12/2019 | Miyamoto | B61C 17/00 |
| 2017/0350164 | A1 * | 12/2017 | Ikemoto | E05B 11/02 |
| 2018/0084656 | A1 * | 3/2018 | Miyamoto | B61C 17/00 |
| 2026/0164625 | A1 * | 6/2026 | Watai | H05K 7/2089 |

FOREIGN PATENT DOCUMENTS

| | | |
|---|---|---|
| JP | 2021151067 A | 9/2021 |
| WO | 2016103329 A1 | 6/2016 |

OTHER PUBLICATIONS

International Search Report (PCT/ISA/210) with translation and Written Opinion (PCT/ISA/237) mailed on Sep. 27, 2022, by the Japan Patent Office as the International Searching Authority for International Application No. PCT/JP2022/028824. (11 pages).

Office Action dated Aug. 6, 2026, issued in the corresponding Indian Patent Application No. 202527003323. (6 pages).

* cited by examiner

ELECTRONIC DEVICE

TECHNICAL FIELD

The present disclosure relates to an electronic device.

BACKGROUND ART

An electronic device, such as a propulsion control device or a power supply device installed on a railway vehicle, includes a housing accommodating electronic components. To safely perform maintenance work on the electronic components, some electronic devices have structures that suppress power supply to the electronic devices when covers of the housings are opened. Examples of the electronic devices of this type are disclosed in Patent Literature 1.

CITATION LIST

Patent Literature

Patent Literature 1: Unexamined Japanese Utility Model Application Publication No. H4-76530

SUMMARY OF INVENTION

Technical Problem

The electronic device disclosed in Patent Literature 1 includes a microswitch that switches on and off in response to opening and closing of the cover of the housing, and a relay that is disposed in an electrical circuit for pantograph rise and switches between energized and disconnected states in response to the microswitch state. When the cover is opened, the relay switches to the disconnected state, electrically disconnecting the main circuit from the power supply. Thus, even if a switch for pantograph rise is accidentally operated during maintenance work, no power is supplied to the electronic device.

To further ensure the safety of main circuit maintenance work in the electronic device disclosed in Patent Literature 1, high-voltage electronic components in the main circuit, such as a capacitor, need to be discharged before maintenance work, with the main circuit electrically disconnected from a power supply when the cover is opened, as described above. To further enhance the safety of the electronic device, a switch may be provided to electrically connect the capacitor to a discharge resistor when the electronic device is turned off, ensuring the capacitor is discharged. The switch is formed, for example, as an electronically controllable switch. However, occurrence of a malfunction in the electronically controllable switch may cause incapability to connect the capacitor to the discharge resistor and discharge the capacitor before maintenance work.

Under such circumstances, an objective of the present disclosure is to provide an electronic device with high safety.

Solution to Problem

To achieve the above objective, an electronic device according to the present disclosure includes a housing, a discharge switch, a first cover, and a displacement limiting member. The housing has a first opening. The housing accommodates an electronic component and a discharge resistor for discharging the electronic component. The discharge switch is accommodated in the housing and includes a pair of terminals and a movable member. One of the pair of terminals is electrically connected to the electronic component, and the other of the pair of terminals is electrically connected to the discharge resistor. The movable member is made of a conductor and is positioned in a conductive position where the movable member is in contact with both of the pair of terminals or in a non-conductive position where the movable member is spaced apart from at least one of the pair of terminals. The first cover is openable and closable and covers the first opening. The displacement limiting member allows the movable member to be positioned in the conductive position when the first cover is opened and maintains the movable member in the non-conductive position when the first cover is closed. When the movable member of the discharge switch is positioned in the conductive position, the electronic component is electrically connected to the discharge resistor, and when the movable member of the discharge switch is positioned in the non-conductive position, the electronic component is electrically disconnected from the discharge resistor.

Advantageous Effects of Invention

The displacement limiting member included in the electronic device of the present disclosure allows the movable member to be positioned in the conductive position when the first cover is opened. This leads to electrical connection of the electronic component with the discharge resistor when the first cover is opened. The electronic device can thus have high safety.

DESCRIPTION OF EMBODIMENTS

Figure 1:
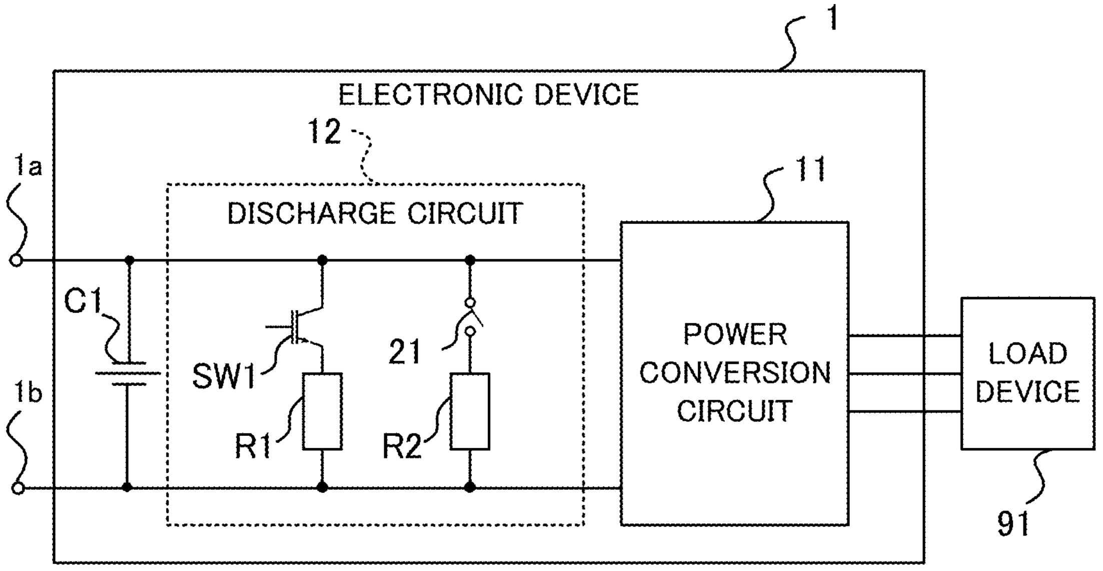
FIG. 1 is a circuit diagram of an electronic device according to Embodiment 1.

An electronic device according to one or more embodiments of the present disclosure is described below in detail with reference to the drawings. In the drawings, the same or equivalent components are provided with the same reference signs.

Embodiment 1

As an example of an electronic device, a direct current (DC)-three-phase converter is installed on a railway vehicle to convert DC power supplied from a DC power supply to three-phase alternating current (AC) power and to supply the AC power to a motor. An electronic device 1 according to Embodiment 1 is described using the DC to three-phase AC power converter as an example. The electronic device 1 illustrated in FIG. 1 is installed in a railway vehicle of a DC feeding system. The electronic device 1 converts supplied DC power into AC power to be supplied to a load device 91 and supplies the converted AC power to the load device 91. The load device 91 is, for example, a three-phase induction motor that generates propulsion of the railway vehicle.

The electronic device 1 illustrated in FIG. 1 includes an input terminal Ta to be connected to a power supply, and an input terminal 1*b* to be grounded. The electronic device 1 further includes a power conversion circuit 11 that converts DC power supplied from a power supply into AC power, a capacitor C1 connected between the input terminals 1*a* and 1*b*, and a discharge circuit 12 connected in parallel with the capacitor C1. The discharge circuit 12 includes a switching element SW1 and a discharge resistor R1 that are connected in series, and a discharge switch 21 and a discharge resistor R2 that are connected in series.

The input terminal Ta is connected to a power supply, specifically, a current collector through, for example, a contactor or a reactor, which is not illustrated. The current collector receives power from an electrical substation through a power supply line. For example, the current collector is a pantograph or a current collector shoe, and the power supply line is an overhead power line or a third rail. The input terminal Tb is short-circuited to rails through, for example, a ground brush, a ground ring, or a wheel, which are not illustrated, and is grounded.

The capacitor C1 is located between primary terminals of the power conversion circuit 11 and is charged with the DC power supplied from the power supply. The capacitor C1 and the unillustrated reactor together serve as an LC filter to reduce harmonic components generated by switching operation of the power conversion circuit 11.

The power conversion circuit 11 converts the DC power supplied through the capacitor C1 into three-phase AC power and outputs the three-phase AC power to the load device 91. The voltage and frequency of the three-phase AC power output by the power conversion circuit 11 is adjustable. The power conversion circuit 11 includes a plurality of switching elements, such as insulated-gate bipolar transistors (IGBTs), gate turn-off thyristors (GTOs), metal-oxide-semiconductor field effect transistors (MOSFETs).

The plurality of switching elements included in the power conversion circuit 11 is controlled by control signals supplied from an unillustrated power conversion control device, and switches on and off. The plurality of switching elements performs switching operation to cause the power conversion circuit 11 to perform power conversion.

The switching element SW1 and the discharge resistor R1 are connected in parallel with the capacitor C1. The switching element SW1 is electrically controlled by an unillustrated switching controller. For example, the switching element SW1 has a configuration similar to that of the switching element included in the power conversion circuit 11. The switching element SW1 is controlled by a control signal output by the switching controller and switches on and off.

Upon turn-on of the switching element SW1, the discharge resistor R1 is electrically connected to the capacitor C1 and the capacitor C1 is discharged. With the switching element SW1 being off, the discharge resistor R1 is electrically disconnected from the capacitor C1. For example, when a voltage between terminals of the capacitor C1 becomes overvoltage, the switching controller turns on the switching element SW1 to discharge the capacitor C1. Then, when the voltage between the terminals of the capacitor C1 is within a target voltage range, the switch controller turns off the switching element SW1. This causes the capacitor C1 to be electrically disconnected from the discharge resistor R1.

The discharge switch 21 and the discharge resistor R2 are connected in parallel with the capacitor C1. The discharge switch 21 is switched on and off by mechanical operation. Upon turn-on of the discharge switch 21, the discharge resistor R2 is electrically connected to the capacitor C1 and the capacitor C1 is discharged. With the discharge switch 21 being off, the discharge resistor R2 is electrically disconnected from the capacitor C1.

Figure 2:
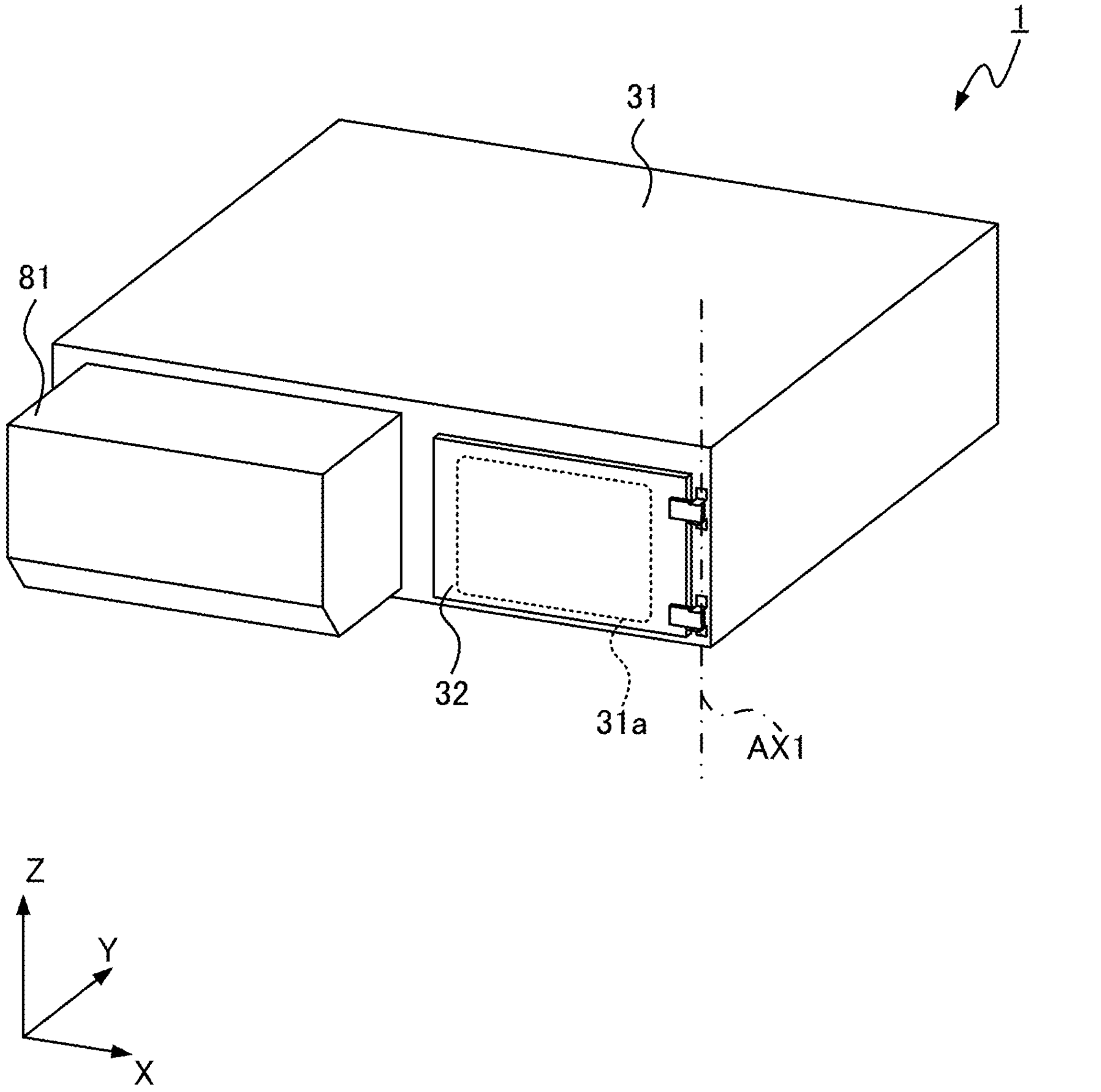
FIG. 2 is a perspective view of the electronic device according to Embodiment 1.

The structure of the electronic device 1 is described in detail below. As illustrated in FIG. 2, the electronic device 1 includes a housing 31 that accommodates an electronic component that is a component of the electronic device 1 illustrated in FIG. 1 and discharge resistors R1 and R2 for discharging a capacitor C1, which is an example of the electronic component. The housing 31 has a first opening 31*a* to enable maintenance work of the component of the electronic device 1.

The electronic device 1 further includes a first cover 32 that is openable and closable and covers the first opening 31*a*, and a cooling device 81 thermally connected to electronic components that are accommodated inside the housing 31 and generate heat when energized. The cooling device 81 cools the electronic components by dissipating the heat transferred from the electronic components to the surrounding air.

In FIG. 2, the Z-axis direction indicates the vertical direction. The direction in which the first opening 31*a* extends through is defined as a Y-axis direction. The axis orthogonal to the Z-axis and the Y-axis is defined as the X-axis. The same applies to the subsequent figures. For example, the electronic device 1 is mounted under a floor of the railway vehicle by an unillustrated suspension device, with the Y-axis aligned with the width direction of the railway vehicle and the X-axis aligned with the travel direction of the railway vehicle.

The housing 31 has the first opening 31*a* on the side surface, specifically, on a surface facing in a negative Y-axis direction.

The first cover 32 rotates around a rotation axis AX1 parallel to the Z-axis, thereby opening and closing the first opening 31*a*. The first cover 32 is made of a plate-like material that can cover the entire first opening 31*a* and the surrounding area of the first opening 31*a*.

The cooling device 81 includes, for example, a heat-receiving block thermally connected to the electronic components inside the housing 31, fins attached to the heat-receiving block and exposed outside the housing 31, and a cover that covers the heat-receiving block and the fins and has ventilation holes. Heat generated by the electronic components is transferred through the heat-receiving block and the fins to the air that flows through the ventilation holes of the cover into the interior of the cover, thereby cooling the electronic components.

Figure 3:
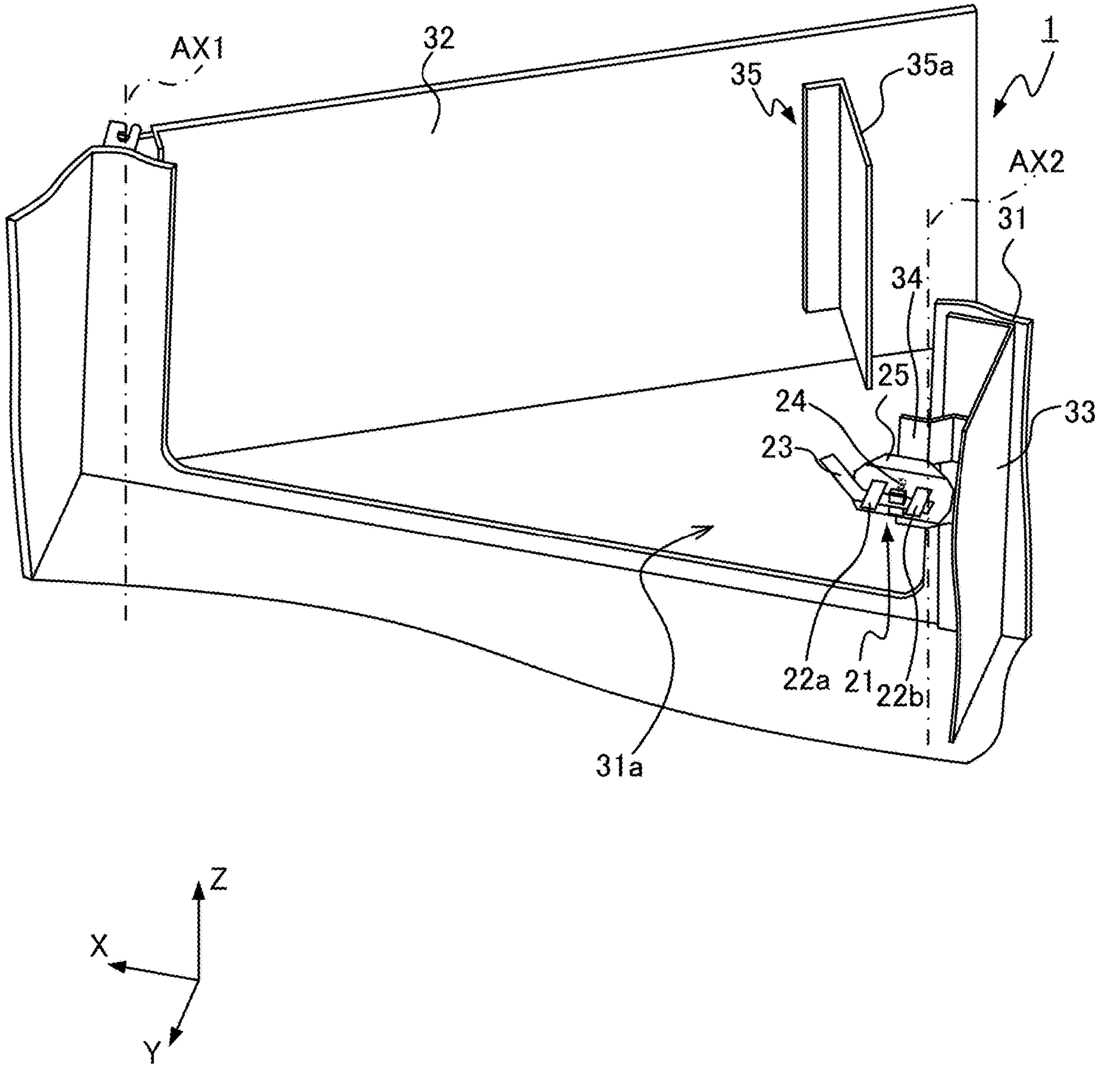
FIG. 3 is a diagram illustrating a displacement limiting member and a discharge switch according to Embodiment 1, the discharge switch being in an on state.
Figure 4:
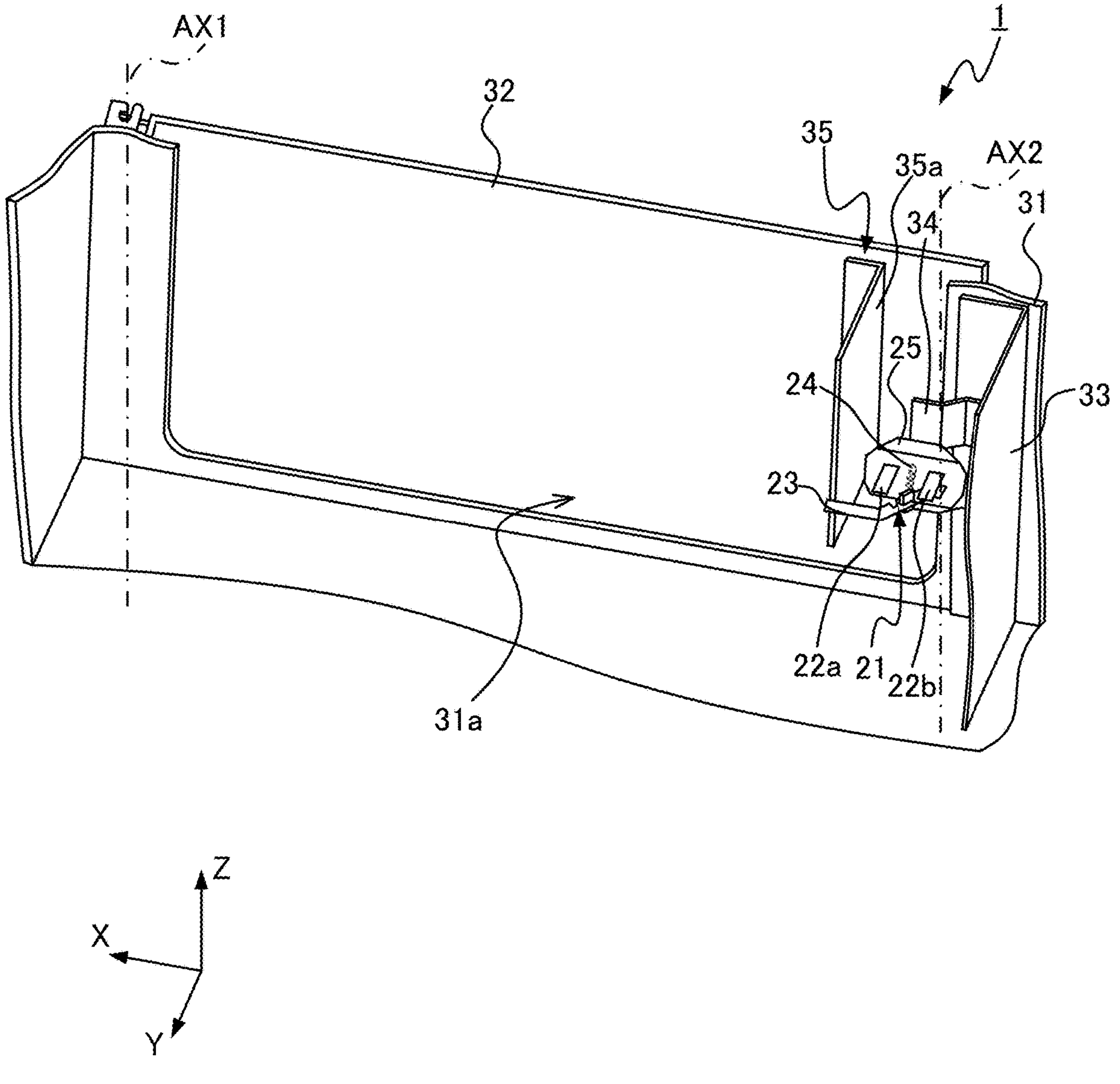
FIG. 4 is a diagram illustrating the displacement limiting member and the discharge switch according to Embodiment 1, the discharge switch being in an off state.

The structure to enhance safety of the electronic device 1 is described in detail below. FIGS. 3 and 4 are diagrams illustrating the electronic device 1 as viewed from the interior of the housing 31 to the first cover 32. To simplify the drawings, FIGS. 3 and 4 simply illustrate the discharge switch 21 among the components of the electronic device 1 accommodated in the interior of the housing 31. With the first cover 32 opened as illustrated in FIG. 3, the discharge switch 21 is turned on. As illustrated in FIG. 4, with the first cover 32 closed, the discharge switch 21 is turned off.

The discharge switch 21 includes a pair of terminals 22*a* and 22*b* and a movable member 23 positioned in a conductive position or a non-conductive position. Preferably, the discharge switch 21 further includes an urging member 24 that urges the movable member 23 to the conductive position. The discharge switch 21 further includes a terminal holding member 25 that holds the pair of terminals 22*a* and 22*b*.

The electronic device 1 further includes a fixed frame 33 fixed to an inner surface of the housing 31, and a support member 34 that is attached to the fixed frame 33 and supports the discharge switch 21. The electronic device 1 further includes a displacement limiting member 35 that allows the movable member 23 to be positioned in the conductive position when the first cover 32 is opened and maintains the movable member 23 in the non-conductive position when the first cover 32 is closed.

Figure 5:
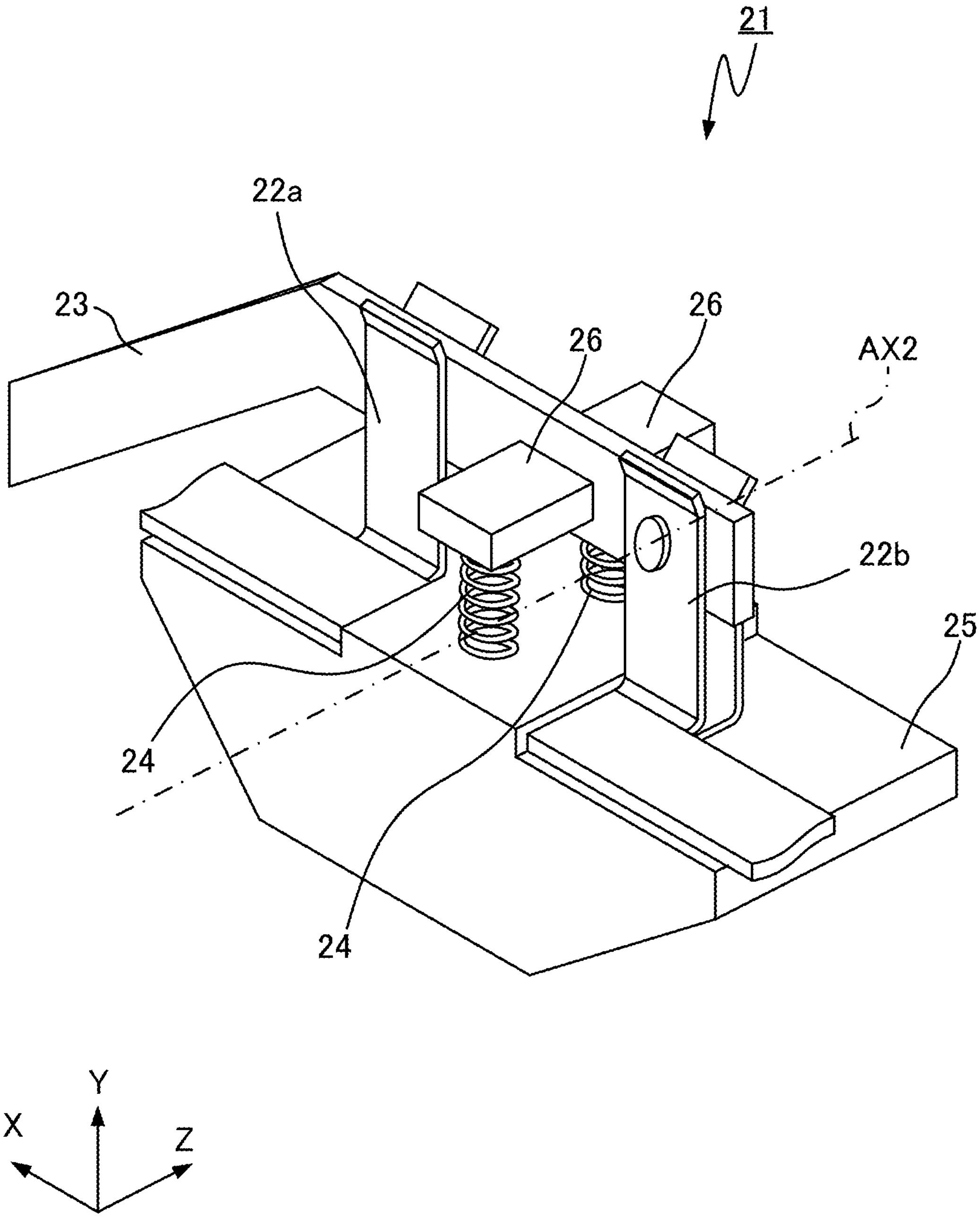
FIG. 5 is a perspective view of the discharge switch according to Embodiment 1.

As illustrated in FIG. 5, which is a perspective view of the discharge switch 21, in Embodiment 1, the terminals 22*a* and 22*b* each have a shape sandwiching the movable member 23 in the Z-axis direction. One of the terminals 22*a* and 22*b* is electrically connected to the electronic component to be discharged, that is, the capacitor C1. The other of the terminals 22*a* and 22*b* is electrically connected to the discharge resistor R2. In Embodiment 1, the one of the terminals 22*a* and 22*b* is electrically connected to a point of connection between the input terminal Ta and the power conversion circuit 11 illustrated in FIG. 1, and the other of the terminals 22*a* and 22*b* is electrically connected to the discharge resistor R2.

The movable member 23 is made of a conductor. In Embodiment 1, the movable member 23 is made of a plate-like metal member. The movable member 23 is positioned in the conductive position where the movable member 23 is in contact with both the terminals 22*a* and 22*b* as illustrated in FIGS. 3 and 5, or in the non-conductive position where the movable member 23 is spaced apart from at least one of the terminals 22*a* and 22*b* as illustrated in FIG. 4. In Embodiment 1, as illustrated in FIG. 5, one end of the movable member 23 is fixed to the terminal 22*b* by a fastening member. The movable member 23 revolves around a rotation axis AX2 extending in parallel to the Z-axis, with one end fixed to the terminal 22*b*.

The discharge switch 21 includes a pair of urging members 24 positioned such that the movable member 23 is between the pair of urging members 24 in the Z-axis direction. The urging members 24 urge the movable member 23 to the conductive position. In Embodiment 1, the urging members 24 are made of an elastic body that deforms under external force and returns to an original shape when the external force is removed. The movable member 23 is positioned in the conductive position when the elastic body has the original shape. Specifically, the urging members 24 is made of a coil spring having one end attached to the terminal holding member 25 and the other end attached through an insulating member 26 to the movable member 23. When the coil spring is at its natural length, the movable member 23 is in the conductive position. When the movable member 23 rotates clockwise from the position in FIG. 5, as viewed in the positive Z-axis direction, to the non-conductive position, the urging member 24 made of the coil spring generates a force in the direction of returning to its natural length. In other words, the urging members 24 pull the movable member 23 from the non-conducting position toward the conducting position. This urges the movable member 23 from the non-conducting position toward the conducting position.

The terminal holding member 25 holds the terminals 22*a* and 22*b* insulated from each other. The terminal holding member 25 is made of an insulating material, for example, resin.

As illustrated in FIGS. 3 and 4, the fixed frame 33 is fixed to the inner surface of the housing 31 in contact with the inner surface of the housing 31. The fixed frame 33 has such high rigidity and strength as to resist deformation under the expectable maximum vibration from the railway vehicle. For example, the fixed frame 33 is made of a metal member, such as iron or aluminum. The fixed frame 33 may be fixed to the housing 31 firmly enough to maintain a constant positional relationship relative to the housing 31 under vibrations from the railway vehicle that is traveling. The fixed frame 33 is fixed to the housing 31 with a fixing method such as fastening by a fastening member, adhesive bonding, welding, or brazing.

The support member 34 has such high rigidity and strength as to resist deformation under the expectable maximum vibration from the railway vehicle. For example, the support member 34 is made of a metal member, such as iron or aluminum. The support member 34 may be fixed to the fixed frame 33 firmly enough to maintain a constant positional relationship relative to the fixed frame 33 under vibrations from the railway vehicle that is traveling. The support member 34 is fixed to the fixed frame 33 with a fixing method such as fastening by a fastening member, adhesive bonding, welding, or brazing.

The terminal holding member 25 included in the discharge switch 21 is attached to the support member 34. The terminal holding member 25 may be fixed to the support member 34 firmly enough to maintain a constant positional relationship relative to the support member 34 under vibrations from the railway vehicle that is traveling. For example, the terminal holding member 25 is fixed to the support member 34 by fastening by a fastening member.

The displacement limiting member 35 includes a contact portion 35*a* having a plate-like shape, attached to a side of the first cover 32 facing an interior of the housing 31, and extending in a direction away from the first cover 32. The displacement limiting member 35 has such high rigidity and strength as to resist deformation under the expectable maximum vibration from the railway vehicle. For example, the displacement limiting member 35 is made of a metal member, such as iron or aluminum. The displacement limiting member 35 may be fixed to the first cover 32 firmly enough to maintain a constant positional relationship relative to the first cover 32 under vibrations from the railway vehicle that is traveling. The displacement limiting member 35 is fixed to the first cover 32 with a fixing method such as fastening by a fastening member, adhesive bonding, welding, or brazing. The displacement limiting member 35 is preferably insulated.

As illustrated in FIG. 4, with the first cover 32 closed, the contact portion 35*a* of the displacement limiting member 35 comes in contact with the movable member 23 and pushes the movable member 23 toward the positive Y-axis direction. The movable member 23 thereby revolves around the rotation axis AX2 with one end fixed to the terminal 22*b* to move away from the terminal 22*a*. As a result, the movable member 23 is positioned in the non-conductive position. With the first cover 32 closed, the displacement limiting member 35 maintains the movable member 23 in the non-conductive position.

During operation of the railway vehicle, the power conversion circuit 11 performs power conversion by means of switching operation of a plurality of switching elements in the power conversion circuit 11. When the railway vehicle stops operating, that is, when the electronic device 1 stops operating, the power conversion control device turns off the plurality of switching elements of the power conversion circuit 11. Then, the switching controller turns on the switching element SW1, and the capacitor C1 is electrically connected to the discharge resistor R1 and is discharged.

Maintenance work on the electronic device 1 is performed with the operation of the electronic device 1 stopped. In the maintenance work, when the first cover 32 is opened as illustrated in FIG. 3, the contact portion 35*a* of the displacement limiting member 35 moves away from the movable member 23 as the first cover 32 rotates. Thus, the urging member 24 urges the movable member 23 from the non-conductive position to the conductive position. As a result, the movable member 23 comes in contact with the terminals 22*a* and 22*b* and the discharge switch 21 is turned on. Upon turn-on of the discharge switch 21, the capacitor C1 is electrically connected to the discharge resistor R2 and is discharged. This enables the capacitor C1 to be discharged with the discharge resistor R2 even when the capacitor C1 cannot be discharged with the discharge resistor R1 due to a failure of the switching element SW1.

As described above, the displacement limiting member 35 included in the electronic device 1 according to Embodiment 1 allows the movable member 23 to be positioned in the conductive position when the first cover 32 is opened. The discharge switch 21 is then turned on, and the capacitor C1 is electrically connected to the discharge resistor R2 and is discharged. In other words, when the first cover 32 is opened, the mechanical operation causes the discharge switch 21 to be turned on, thereby enabling the capacitor C1 to which a high voltage is applied to be discharged. Even when the capacitor C1 cannot be discharged by the discharge resistor R1 due to a failure of the switching element SW1, the discharge switch 21 being turned on by the mechanical operation, which is the opening of the first cover 32, enables the capacitor C1 to be discharged with the discharge resistor R2, thereby ensuring safety of the maintenance work.

Embodiment 2

The structure of the discharge switch is not limited to the above example, but can be any structure that is in the off state when the first cover 32 is closed and in the on state when the first cover 32 is opened. The electronic device 1 including a discharge switch having a structure different from that of Embodiment 1 is described in Embodiment 2.

Figure 6:
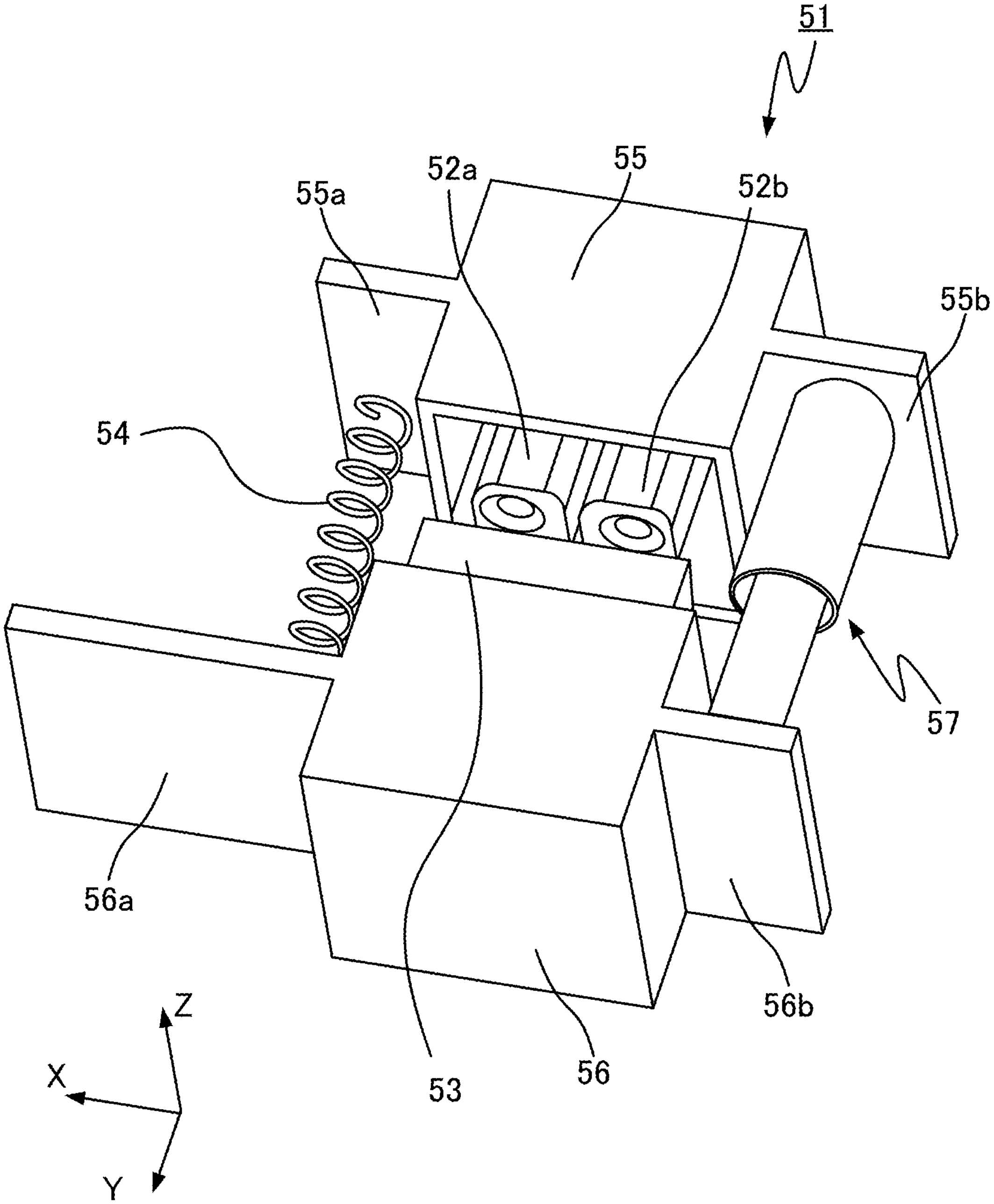
FIG. 6 is a perspective view of a discharge switch according to Embodiment 2, the discharge switch being in an off state.
Figure 7:
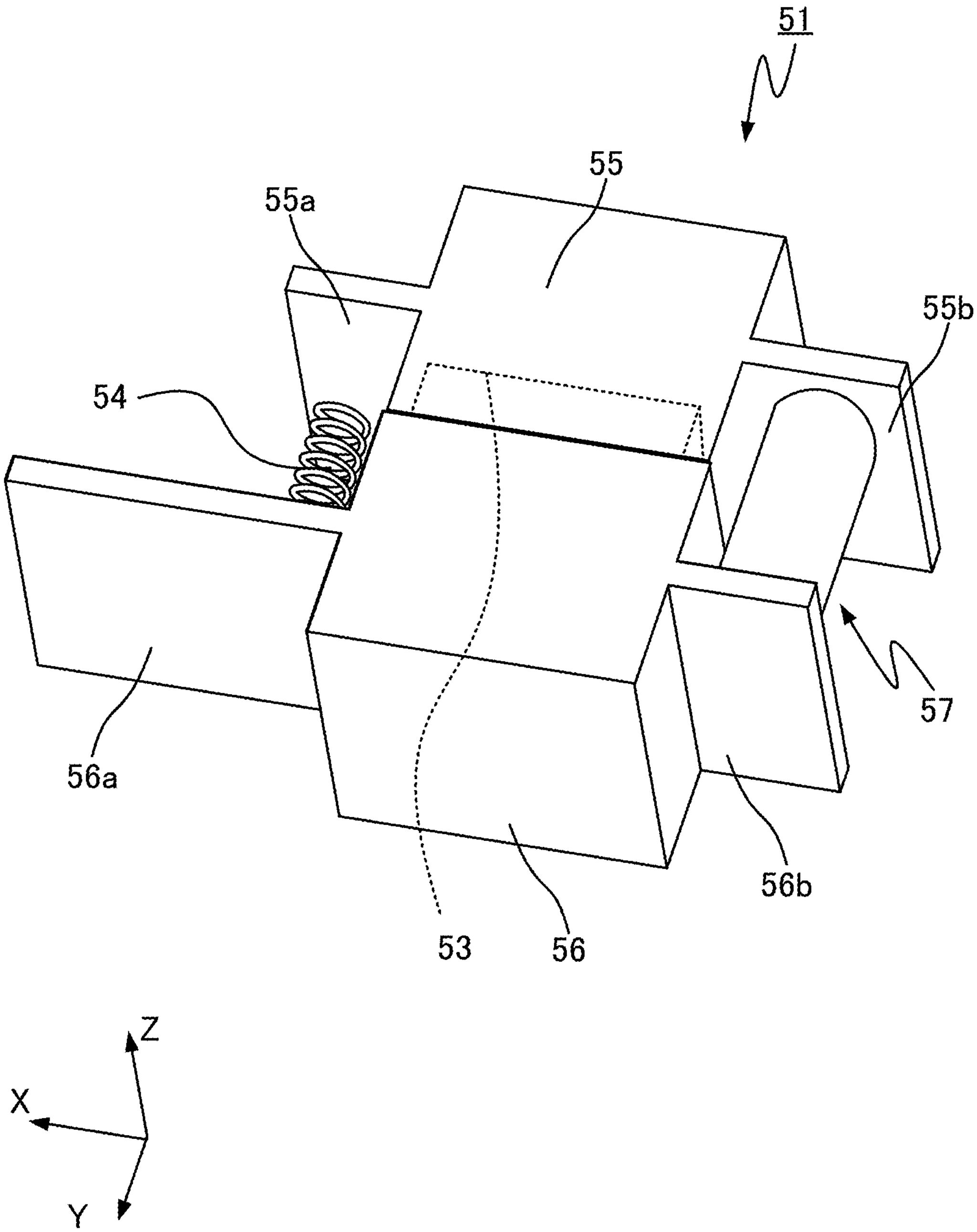
FIG. 7 is a perspective view of the discharge switch according to Embodiment 2, the discharge switch being in an on state.

The electronic device 1 according to Embodiment 2 includes a discharge switch 51 illustrated in FIGS. 6 and 7. The structure of the electronic device 1 other than the discharge switch 51 is similar to that of Embodiment 1. The discharge switch 51 is connected in series with the discharge resistor R2. The discharge switch 51 and the discharge resistor R2 connected in series are connected in parallel with the capacitor C1.

The discharge switch 51 is switched on and off by mechanical operation. Upon turn-on of the discharge switch 51, the discharge resistor R2 is electrically connected to the capacitor C1 and the capacitor C1 is discharged. With the discharge switch 51 being off, the discharge resistor R2 is electrically disconnected from the capacitor C1.

The discharge switch 51 includes a pair of terminals 52*a* and 52*b*, a movable member 53 positioned in the conductive position or the non-conductive position, and an urging member 54 that urges the movable member 53 to the conductive position. The discharge switch 51 further includes a terminal holding member 55 that holds the pair of terminals 52*a* and 52*b* and a movable member holder 56 that holds the movable member 53.

In Embodiment 2, the terminals 52*a* and 52*b* each have a columnar shape extending in the Y-axis direction. One of the terminals 52*a* and 52*b* is electrically connected to the electronic component to be discharged, that is, the capacitor C1. The other of the terminals 52*a* and 52*b* is electrically connected to the discharge resistor R2. In Embodiment 2, the one of the terminals 52*a* and 52*b* is electrically connected to a point of connection between the input terminal 1*a* and the power conversion circuit 11 illustrated in FIG. 1, and the other of the terminals 52*a* and 52*b* is electrically connected to the discharge resistor R2.

The movable member 53 is made of a conductor. In Embodiment 2, the movable member 53 is made of a metal member having a columnar shape and extending in the Y-axis direction, as illustrated in FIG. 6. The movable member 53 has holes into which the terminal 52*a* and 52*b* are fitted. The movable member 53 is positioned in the conductive position where the movable member 53 is in contact with both the terminals 52*a* and 52*b* as illustrated in FIG. 7, or in the non-conductive position where the movable member 53 is spaced apart from both the terminals 52*a* and 52*b* as illustrated in FIG. 6.

The discharge switch 51 includes the urging member 54 extending in the Y-axis direction. The urging member 54 urges the movable member 53 to the conductive position. The urging member 54 is made of an elastic body that deforms under external force and returns to an original shape when the external force is removed. The movable member 53 is positioned in the conductive position when the elastic body has the original shape. Specifically, the urging member 54 is made of a coil spring having one end attached to the terminal holding member 55 and the other end attached to the movable member holder 56. When the coil spring is at its natural length, the movable member 53 is in the conductive position as illustrated in FIG. 7.

When the movable member holder 56 holding the movable member 53 moves from the position of FIG. 7 to the positive Y-axis direction and the movable member 53 is positioned in the non-conductive position, the urging member 54 made of the coil spring generates a force in the direction of returning to its natural length. This urges the movable member holder 56 to the negative Y-axis direction. In other words, the movable member 53 is urged from the non-conducting position toward the conducting position.

The terminal holding member 55 holds the terminals 52*a* and 52*b* insulated from each other. The terminal holding member 55 is made of an insulating material, for example, resin. In Embodiment 2, as illustrated in FIG. 6, the terminal holding member 55 has a box shape opening in the positive Y-axis direction and accommodates the terminals 52*a* and 52*b* inside, spaced apart from each other. An attachment portion 55*a* having a flat-plate shape and having a main surface orthogonal to the Y-axis is provided on the side of the terminal holding member 55 facing in the positive X-axis direction. An attachment portion 55*b* having a flat-plate shape and having a main surface orthogonal to the Y-axis is provided on the side of the terminal holding member 55 facing in the negative X-axis direction.

The movable member holder 56 is made of an insulating material, for example, resin. In Embodiment 2, the movable member holder 56 has a box shape opening in the negative Y-axis direction and accommodates the movable member 53, with a portion of the movable member 53 exposed. An attachment portion 56*a* having a flat-plate shape and having a main surface orthogonal to the Y-axis is provided on the side of the movable member holder 56 facing in the positive X-axis direction. An attachment portion 56*b* having a flat-plate shape and having a main surface orthogonal to the Y-axis is provided on the side of the movable member holder 56 facing in the negative X-axis direction.

The urging member 54 has one end attached to the attachment portion 55*a* of the terminal holding member 55 and the other end attached to the attachment portion 56*a* of the movable member holder 56. The movable member holder 56 is attached to the terminal holding member 55 via an extending-contracting mechanism 57 that is extendable and contractible in the Y-axis direction. Specifically, the extending-contracting mechanism 57 has one end attached to the attachment portion 55*b* of the terminal holding member 55 and the other end attached to the attachment portion 56*b* of the movable member holder 56.

With the first cover 32 closed, the contact portion 35*a* of the displacement limiting member 35 comes in contact with the attachment portion 56*a* of the movable member holder 56 and pushes the movable member holder 56 in the positive Y-axis direction. As a result, the movable member 53 moves in the positive Y-axis direction integrally with the movable member holder 56 and spaced apart from both the terminals 52*a* and 52*b*. In other words, the movable member 53 is positioned in the non-conductive position. With the first cover 32 closed, the displacement limiting member 35 maintains the movable member 53 in the non-conductive position.

During operation of the railway vehicle, the power conversion circuit 11 performs power conversion by means of switching operation of a plurality of switching elements in the power conversion circuit 11. When the railway vehicle stops operating, that is, when the electronic device 1 stops operating, the power conversion control device turns off the plurality of switching elements of the power conversion circuit 11. Then, the switching controller turns on the switching element SW1, and the capacitor C1 is electrically connected to the discharge resistor R1 and is discharged.

Maintenance work on the electronic device 1 is performed with the operation of the electronic device 1 stopped. In the maintenance work, when the first cover 32 is opened, the contact portion 35*a* of the displacement limiting member 35 moves away from the movable member holder 56 as the first cover 32 rotates. Thus, the urging member 54 urges the movable member holder 56 to the negative Y-axis direction. As a result, as illustrated in FIG. 7, the movable member 53 is urged from the non-conductive position to the conductive position, and the movable member 53 comes in contact with both the terminals 52*a* and 52*b* and the discharge switch 51 is turned on. Upon turn-on of the discharge switch 51, the capacitor C1 is electrically connected to the discharge resistor R2 and is discharged. This enables the capacitor C1 to be discharged with the discharge resistor R2 even when the capacitor C1 cannot be discharged with the discharge resistor R1 due to a failure of the switching element SW1.

As described above, the displacement limiting member 35 included in the electronic device 2 according to Embodiment 2 allows the movable member 53 to be positioned in the conductive position when the first cover 32 is opened. The discharge switch 51 is then turned on, and the capacitor C1 is electrically connected to the discharge resistor R2 and is discharged. In other words, when the first cover 32 is opened, the mechanical operation causes the discharge switch 51 to be turned on, thereby enabling the capacitor C1 to which a high voltage is applied to be discharged. Even when the capacitor C1 cannot be discharged by the discharge resistor R1 due to a failure of the switching element SW1, the discharge switch 51 being turned on by the mechanical operation, which is the opening of the first cover 32, enables the capacitor C1 to be discharged with the discharge resistor R2, thereby ensuring safety of the maintenance work.

Embodiment 3

The electronic device may include an interlock mechanism that suppresses closing of the first cover 32 when another cover that is different from the first cover 32 is unlocked. An electronic device 2 according to Embodiment 3 is described, focusing on differences from that of Embodiment 1.

Figure 8:
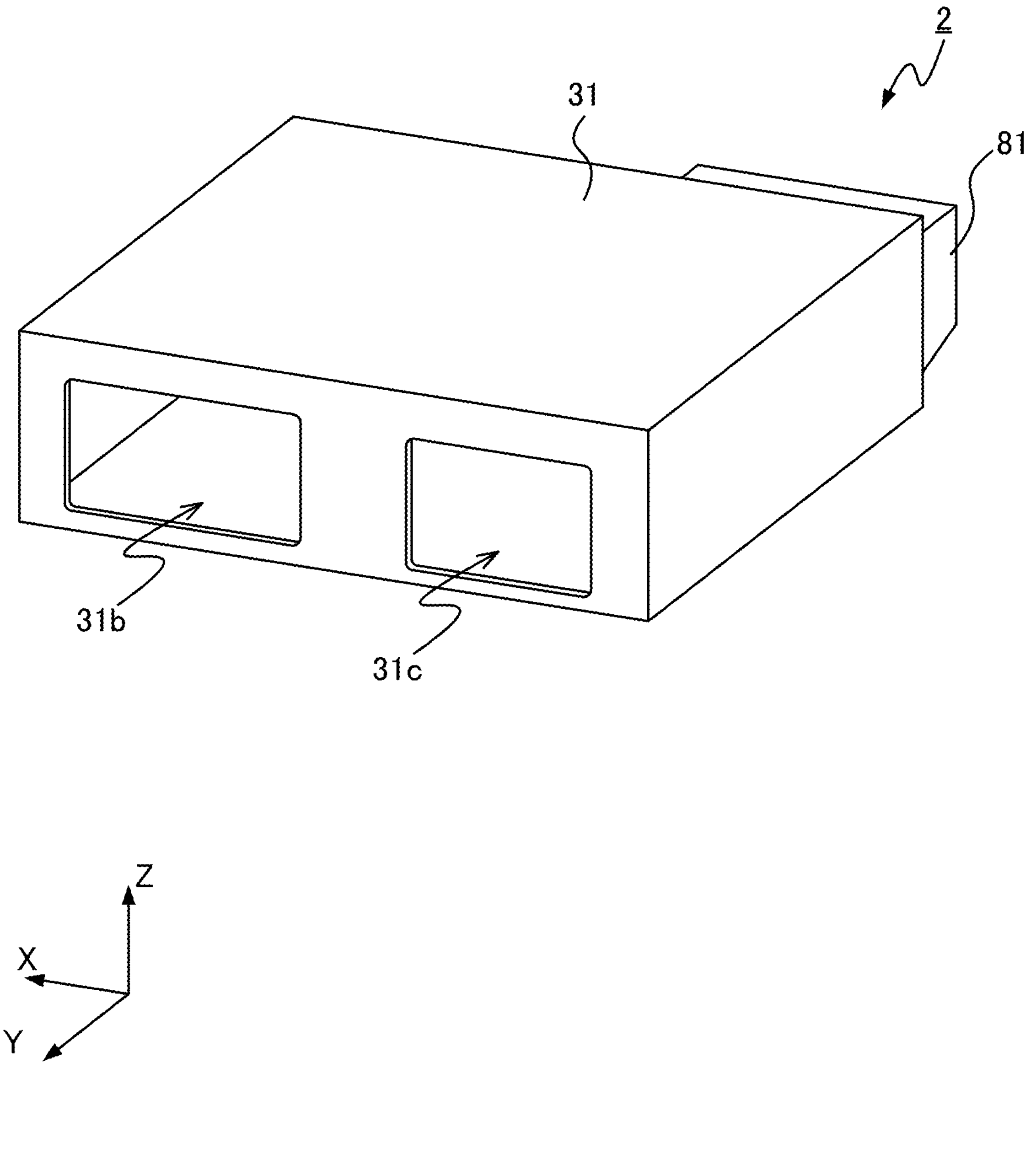
FIG. 8 is a perspective view of a housing according to Embodiment 3.
Figure 9:
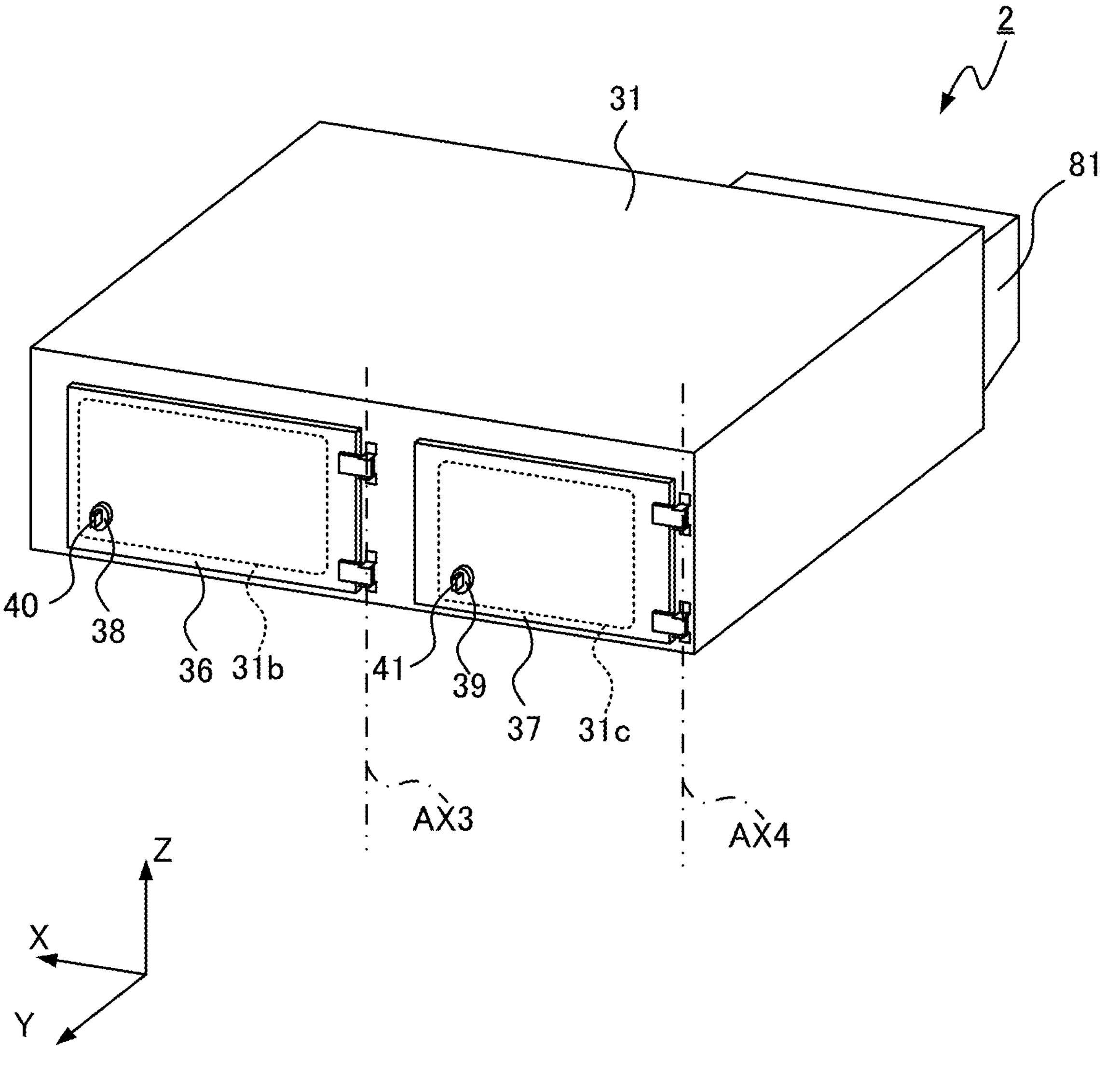
FIG. 9 is a perspective view of an electronic device according to Embodiment 3.

As illustrated in FIG. 8, the housing 31 included in the electronic device 2 has second openings 31*b* and 31*c* on a side opposite to the side in which the first opening 31*a* is made. As illustrated in FIG. 9, the electronic device 2 includes a second cover 36 that is openable and closable and covers the second opening 31*b* and a second cover 37 that is openable and closable and covers the second opening 31*c*. The electronic device 2 further includes a locking mechanism 38 that locks the second cover 36 and a locking mechanism 39 that locks the second cover 37.

The second cover 36 rotates around a rotation axis AX3 parallel to the Z-axis, thereby opening and closing the second opening 31*b*. The second cover 36 is made of a plate-like material that can cover the entire second opening 31*b* and the surrounding area of the second opening 31*b*.

The second cover 37 rotates around a rotation axis AX4 parallel to the Z-axis, thereby opening and closing the second opening 31*c*. The second cover 37 is made of a plate-like material that can cover the entire second opening 31*c* and the surrounding area of the second opening 31*c*.

A key 40 of the locking mechanism 38 is removable only when the second cover 36 is locked. A key 41 of the locking mechanism 39 is removable only when the second cover 37 is locked.

Figure 10:
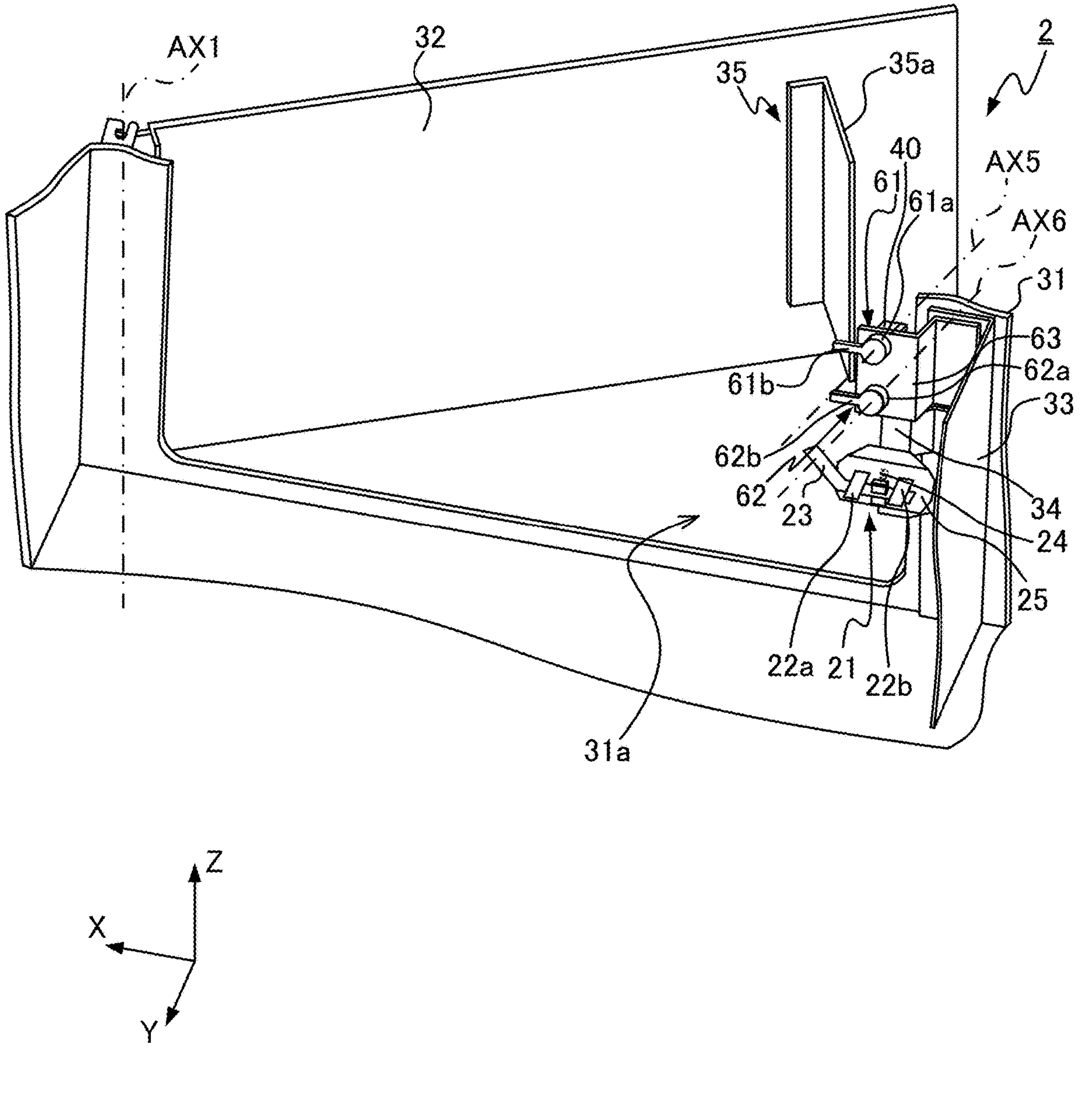
FIG. 10 is a diagram illustrating a displacement limiting member, a discharge switch, and a key holder according to Embodiment 3, the discharge switch being in an on state.
Figure 11:
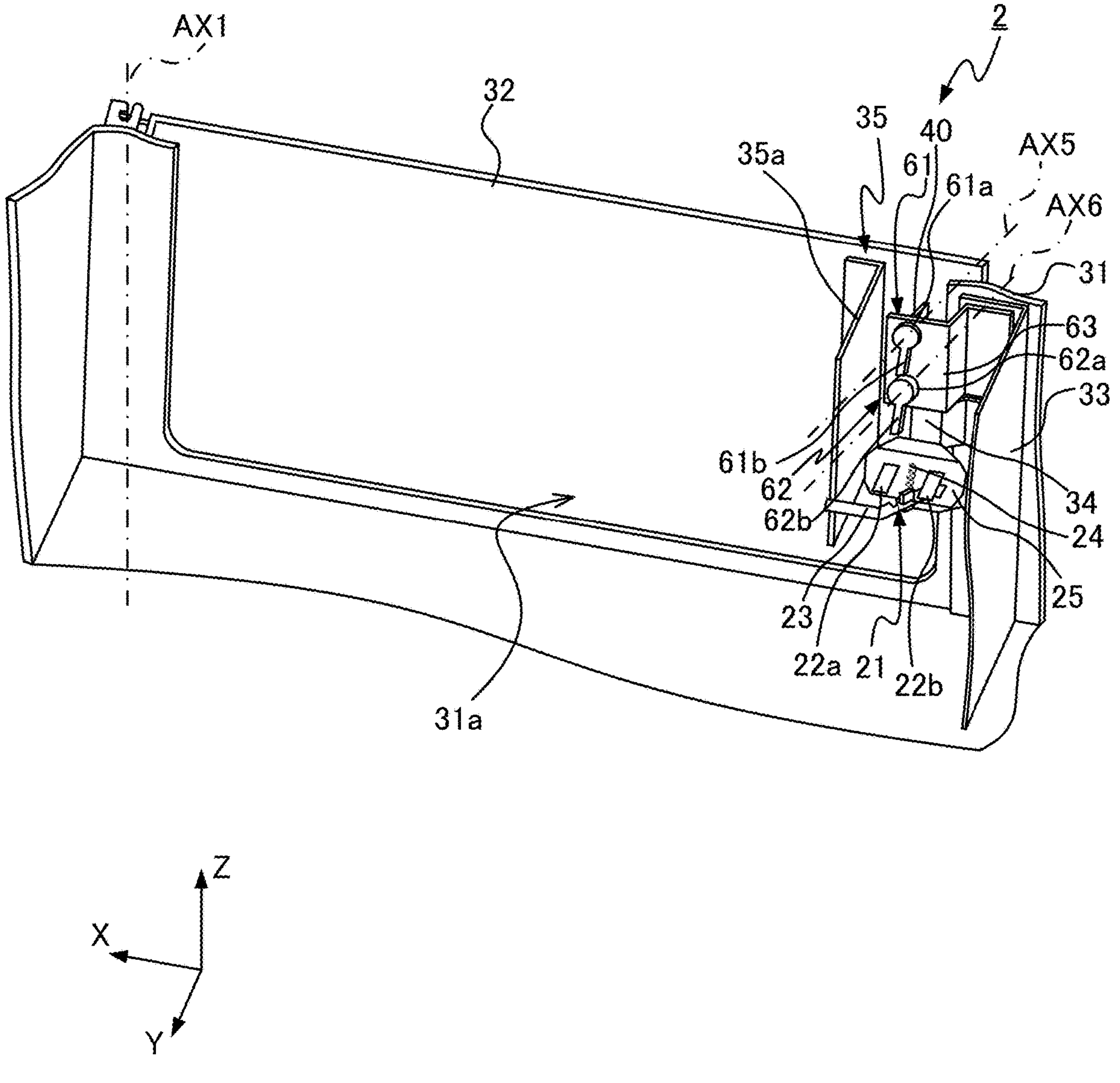
FIG. 11 is a diagram illustrating a displacement limiting member, a discharge switch, and a key holder according to Embodiment 3, the discharge switch being in an off state.

As illustrated in FIGS. 10 and 11, the electronic device 2 includes a key holder 61 that holds the key 40. The electronic device 2 further includes a key holder 62 that holds the key 41 illustrated in FIG. 9. To simplify the drawings, the key 41 is not illustrated in FIGS. 10 and 11. The structure of the electronic device 2 other than the key holders 61 and 62 is similar to that of Embodiment 1. To simplify the drawings, FIGS. 10 and 11 simply illustrate the discharge switch 21 among the components of the electronic device 2 accommodated in the interior of the housing 31, and the rotation axis AX2 is not illustrated therein.

The key holder 61 includes a holding mechanism 61*a* that is positioned either in the unlocked position where the key 40 can be inserted and removed as illustrated in FIG. 10 or in the locked position where removal of the inserted key 40 is suppressed as illustrated in FIG. 11. The key holder 61 further includes an opening-closing limiting mechanism 61*b* that suppresses closing of the first cover 32 when the holding mechanism 61*a* is positioned in the unlocked position as illustrated in FIG. 10 and allows the first cover 32 to be closed when the holding mechanism 61*a* is positioned in the locked position as illustrated in FIG. 11.

An insertion direction of the key 40 to the holding mechanism 61*a* matches the direction in which the first opening 31*a* extends through, specifically, the Y-axis direction. The holding mechanism 61*a* has a shape rotatable around a rotation axis AX5 extending in the insertion direction of the key 40. In other words, the holding mechanism 61*a* is rotatable around the rotation axis AX5 in parallel to the Y-axis. The opening-closing limiting mechanism 61*b* is made of a projection attached to the holding mechanism 61*a* and extending in a radial direction orthogonal to the rotation axis AX5 of the holding mechanism 61*a*. The projection rotates around the rotation axis AX5 as the holding mechanism 61*a* rotates.

The structure of the key holder 62 is similar to that of the key holder 61. The key holder 62 includes a holding mechanism 62*a* that is positioned either in the unlocked position where the key 41 can be inserted and removed or in the locked position where removal of the inserted key 41 is suppressed. The key holder 62 further includes an opening-closing limiting mechanism 62*b* that suppresses closing of the first cover 32 when the holding mechanism 62*a* is positioned in the unlocked position as illustrated in FIG. 10 and allows the first cover 32 to be closed when the holding mechanism 62*a* is positioned in the locked position as illustrated in FIG. 11.

An insertion direction of the key 41 to the holding mechanism 62*a* matches the direction in which the first opening 31*a* extends through, specifically, the Y-axis direction. The holding mechanism 62*a* has a shape rotatable around a rotation axis AX6 extending in the insertion direction of the key 41. In other words, the holding mechanism 62*a* is rotatable around the rotation axis AX6 parallel to the Y-axis. The opening-closing limiting mechanism 62*b* is made of a projection attached to the holding mechanism 62*a* and extending in a radial direction orthogonal to the rotation axis AX6 of the holding mechanism 62*a*. The projection rotates around the rotation axis AX6 as the holding mechanism 62*a* rotates.

As illustrated in FIG. 10, when an attempt is made to close the first cover 32 when the holding mechanisms 61*a* and 62*a* are positioned in the unlocked position, the contact portion 35*a* of the displacement limiting member 35 attached to the first cover 32 comes in contact with the opening-closing limiting mechanisms 61*b* and 62*b* made of projections. This suppresses closing of the first cover 32. When the holding mechanisms 61*a* and 62*a* are positioned in the unlocked position, the keys 40 and 41 may be removed from the holding mechanisms 61*a* and 62*a*. This enables the second covers 36 and 37 to be locked. In other words, with the second covers 36 and 37 unlockable, closing of the first cover 32 is suppressed.

As illustrated in FIG. 11, when the holding mechanisms 61*a* and 62*a* are positioned in the locked position, the contact portion 35*a* of the displacement limiting member 35 attached to the first cover 32 does not come in contact with the opening-closing limiting mechanisms 61*b* and 62*b* made of projections. This enables the first cover 32 to be closed. The key 40 removable from the locking mechanism 38 only when the second cover 36 is locked as described above is inserted into the holding mechanism 61*a*. When the holding mechanism 61*a* into which the key 40 is inserted rotates from the unlocked position to the locked position, removal of the key 40 is suppressed, thereby preventing unlocking of the second cover 36. Similarly, the key 41 removable from the locking mechanism 39 only when the second cover 37 is locked is inserted into the holding mechanism 62*a*. When the holding mechanism 62*a* into which the key 41 is inserted rotates from the unlocked position to the locked position, removal of the key 41 is suppressed, thereby preventing unlocking of the second cover 37. Thus, when the second covers 36 and 37 are locked, the keys 40 and 41 are inserted in the corresponding holding mechanisms 61*a* and 62*a*, and the holding mechanisms 61*a* and 62*a* are in the locked position, the first cover 32 can be closed.

As described above, the electronic device 1 according to Embodiment 3 includes an interlock mechanism that suppresses closing of the first cover 32, with the second covers 36 and 37 unlockable. This can promote secure lock of the second covers 36 and 37, and the electronic device 2 can thus have high safety.

The present disclosure is not limited to the above embodiments. The electronic devices 1 and 2 are not limited to DC to three-phase converters, but can be any devices that include the discharge resistor R2 and the discharge switch 21 or the discharge switch 51. As an example, the electronic devices 1 and 2 may be a power conversion device that is installed on a railway vehicle of an AC feeding system and converts the AC power supplied from the power supply to the three-phase AC power. In this case, in addition to the components illustrated in FIG. 1, the electronic devices 1 and 2 may include a converter that converts AC power to DC power, and the capacitor C1 may be discharged with the DC power output by the converter.

As another example, the electronic devices 1 and 2 may be a DC-DC converter that is installable on the railway vehicle of the DC feeding system and converts the DC power supplied from a power supply to the DC power to be supplied to the load device 91, and outputs the converted AC power.

As another example, the electronic devices 1 and 2 may include a plurality of power conversion circuits 11 and capacitors C1 provided for the respective power conversion circuits 11. Here, the electronic devices 1 and 2 may include a common discharge circuit 12 shared by the plurality of power conversion circuits 11 or may include discharge circuits 12 for the respective power conversion circuits 11. In a case where the discharge circuit 12 is provided for each of the plurality of power conversion circuits 11, each discharge switch 21 or each discharge switch 51 may be provided in a position adjacent to the first opening 31*a* Thus, when the first cover 32 is closed, the movable member 23 of each discharge switch 21 or the movable member 53 of each discharge switch 51 may be positioned in the conductive position, and when the first cover 32 is opened, the movable member 23 of each discharge switch 21 or the movable member 53 of each discharge switch 51 may be maintained in the non-conductive position.

The discharge circuit 12 may only include the discharge switch 21 and the discharge resistor R2 without having the switching element SW1 and the discharge resistor R1. Similarly, the discharge circuit 12 may only include the discharge switch 51 and the discharge resistor R2.

The structures of the electronic devices 1 and 2 are not limited to the above examples. Any configuration can be adopted that allows the movable member 23 of each discharge switch 21 or the movable member 53 of each discharge switch 51 to be positioned in the non-conductive position when the first cover 32 is closed, and allows the movable member 23 of each discharge switch 21 or the movable member 53 of each discharge switch 51 to be maintained in the conductive position when the first cover 32 is opened.

As an example, the first cover 32 may rotate around a rotation axis parallel to the X-axis to open and close the first opening 31*a*. Here, the first cover 32 may be positioned vertically above the first cover 32 and rotate around the rotation axis extending in parallel to the X-axis, or may be positioned vertically below the first cover 32 and rotate around the rotation axis extending in parallel to the X-axis.

The structure, attachment position, electrical connection position, the attachment direction, and the like of the discharge switch 21 or the discharge switch 51 are not limited to the above examples, but may be any configuration that allows the discharge switch to be turned off when the first cover 32 is closed and to be turned on when the first cover 32 is opened.

Figure 12:
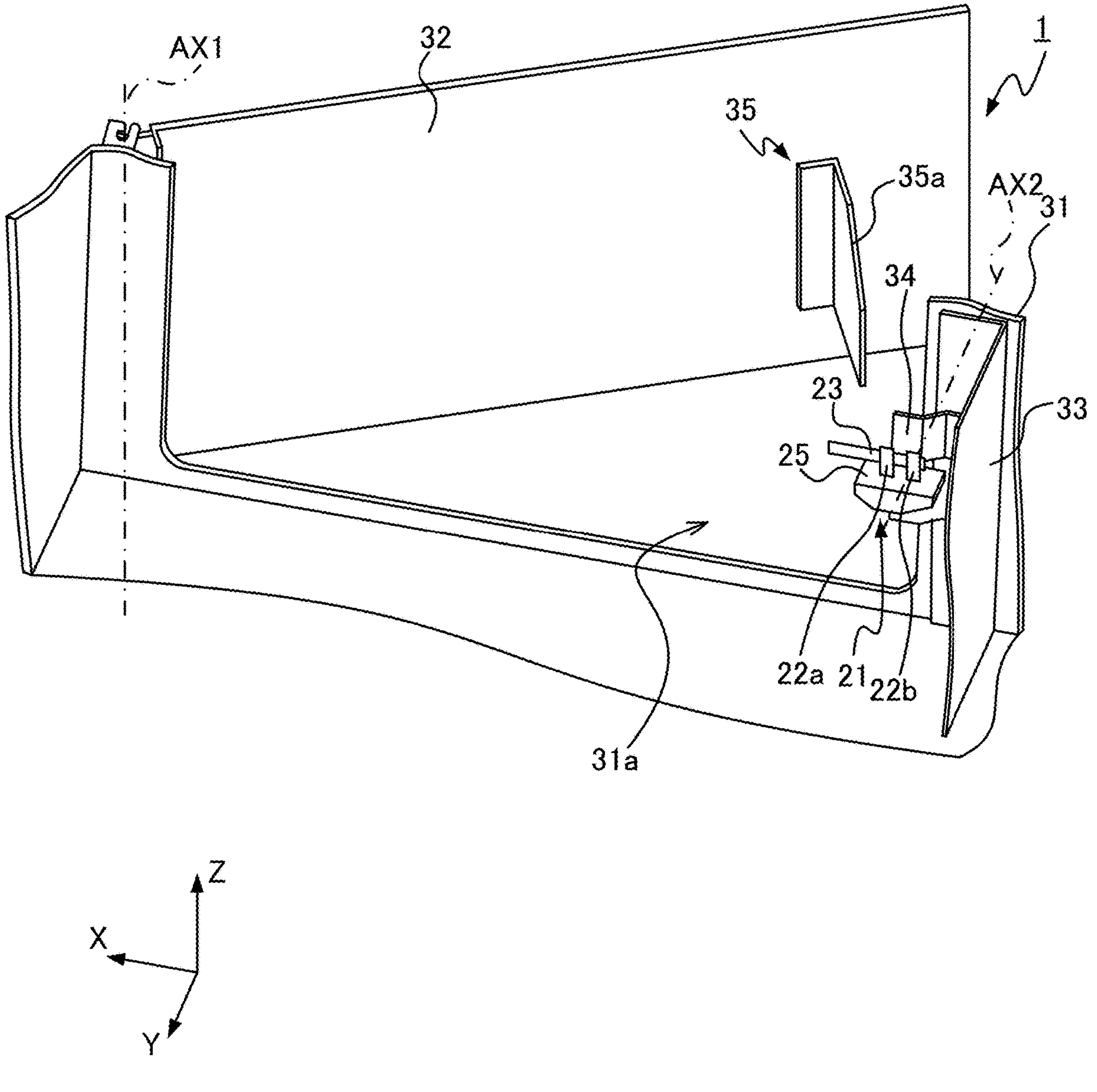
FIG. 12 is a diagram illustrating a modified example of a displacement limiting member, a discharge switch, and a key holder included in a first modified example of an electronic device according to an embodiment, the discharge switch being in an on state.
Figure 13:
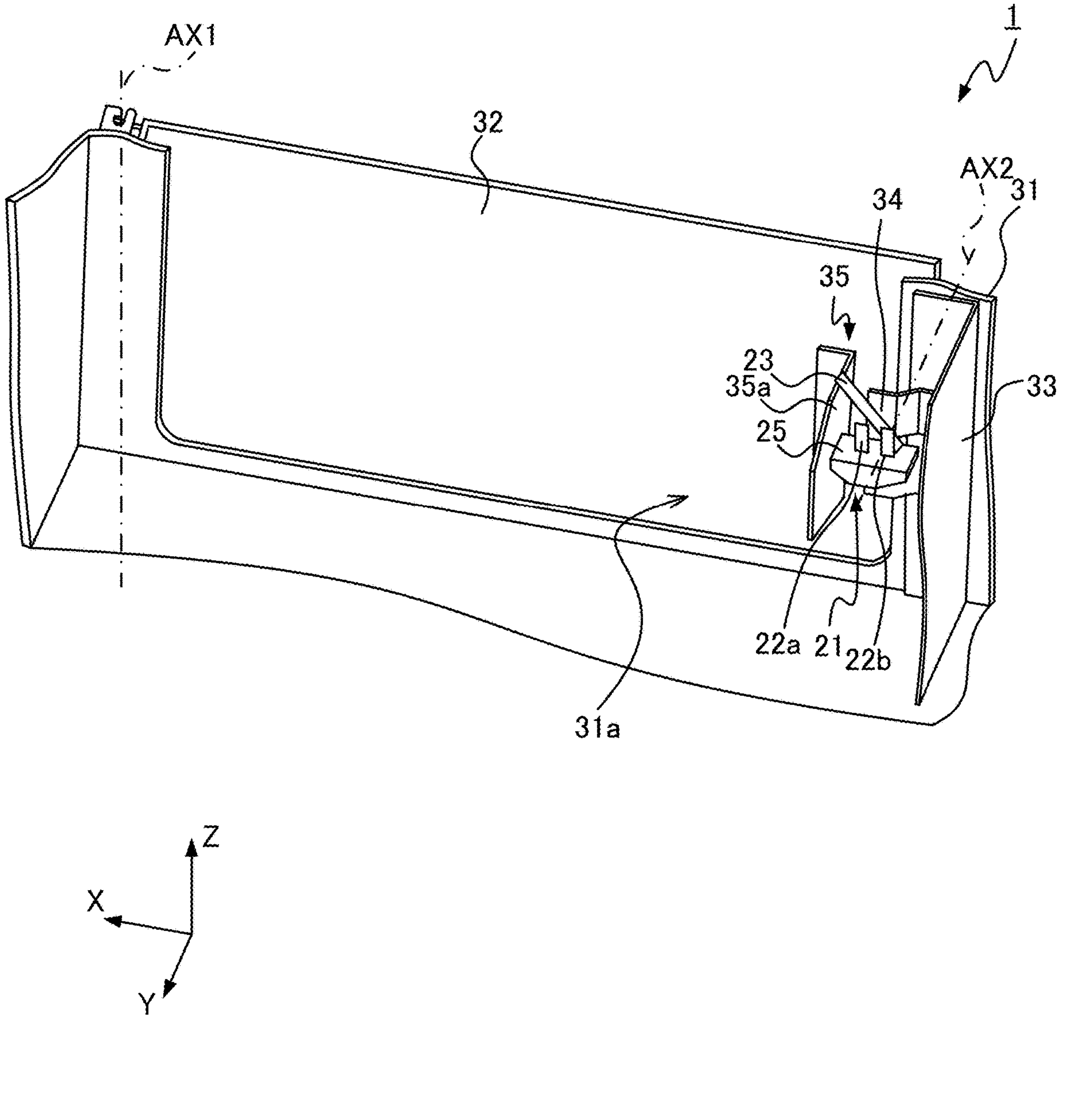
FIG. 13 is a diagram illustrating a modified example of the displacement limiting member, the discharge switch, and the key holder included in the first modified example of the electronic device according to the embodiment, the discharge switch being in an off state.

As an example, the discharge switches 21 and 51 do not necessarily have the urging members 24 and 54. A modified example of the electronic device 1 including the discharge switch 21 without having the urging member 24 is illustrated in FIGS. 12 and 13. When the first cover 32 is closed from a state where the first cover 32 is opened as illustrated in FIG. 12, the contact portion 35*a* of the displacement limiting member 35 comes in contact with the movable member 23 before the first cover 32 is completely closed. When the first cover 32 further moves to the housing 31, the contact portion 35*a* of the displacement limiting member 35 lifts up an end of the movable member 23 vertically upward while coming in contact with the movable member 23. This causes the movable member 23 to revolve around the rotation axis AX2. Specifically, the movable member 23 rotates clockwise as viewed in the negative Y-axis direction. When the first cover 32 is completely closed as illustrated in FIG. 13, the one end of the movable member 23 is spaced apart from the terminal 22*a*. As a result, the discharge switch 21 is turned off.

When the first cover 32 is opened from the state of FIG. 13 and the contact portion 35*a* of the displacement limiting member 35 moves away from the movable member 23, one end of the movable member 23 moves vertically lower by its own weight. This causes the movable member 23 to revolve around the rotation axis AX2. Specifically, the movable member 23 rotates counterclockwise as viewed in the negative Y-axis direction. Then, as illustrated in FIG. 12, the movable member 23 comes in contact with both the terminals 22*a* and 22*b*. As a result, the discharge switch 21 is turned on.

As another example, one of the terminals 22*a* and 22*b* of the discharge switch 21 may be electrically connected to a point of connection between the input terminal 1*b* and the power conversion circuit 11, and the other of the terminals 22*a* and 22*b* may be electrically connected to the discharge resistor R2.

As another example, the discharge switches 21 and 51 are preferably switches that switch on and off by mechanical operation as described above, but may be made of electronic switches, specifically, optical switches, microswitches, or the like, that are turned on when the first cover 32 is opened and are turned off when the first cover 32 is closed.

The urging members 24 and 54 are not limited to coil springs, but can be made of any elastic body, such as leaf springs, disc springs, or rubber. The urging members 24 and 54 may cause urging to the conductive position as indicated by the aforementioned embodiments or may cause urging to the non-conductive position. When the urging members 24 and 54 cause urging to the non-conductive position, for example, the displacement limiting member 35 attached to the first cover 32 may engage with the movable members 23 and 53 when the first cover 32 is opened, and urge the movable members 23 and 53 to the conductive position.

The structure of the displacement limiting member 35 is not limited to the above examples, and may have any structure that allows the displacement limiting member 35 to come in contact with the movable member 23 or the movable member 53 when the first cover 32 is closed, and thereby allows the movable member 23 or the movable member 53 to be maintained in the non-conductive position. As an example, the displacement limiting member 35 may have one end connected to the first cover 32 and have a columnar shape extending in the Y-axis direction.

The embodiments described above may be combined as appropriate. As an example, the electronic device 2 may include a discharge switch 51 illustrated in Embodiment 2. As another example, the electronic device 2 may include the discharge switch 21 and the displacement limiting member 35 illustrated in FIGS. 12 and 13.

Figure 14:
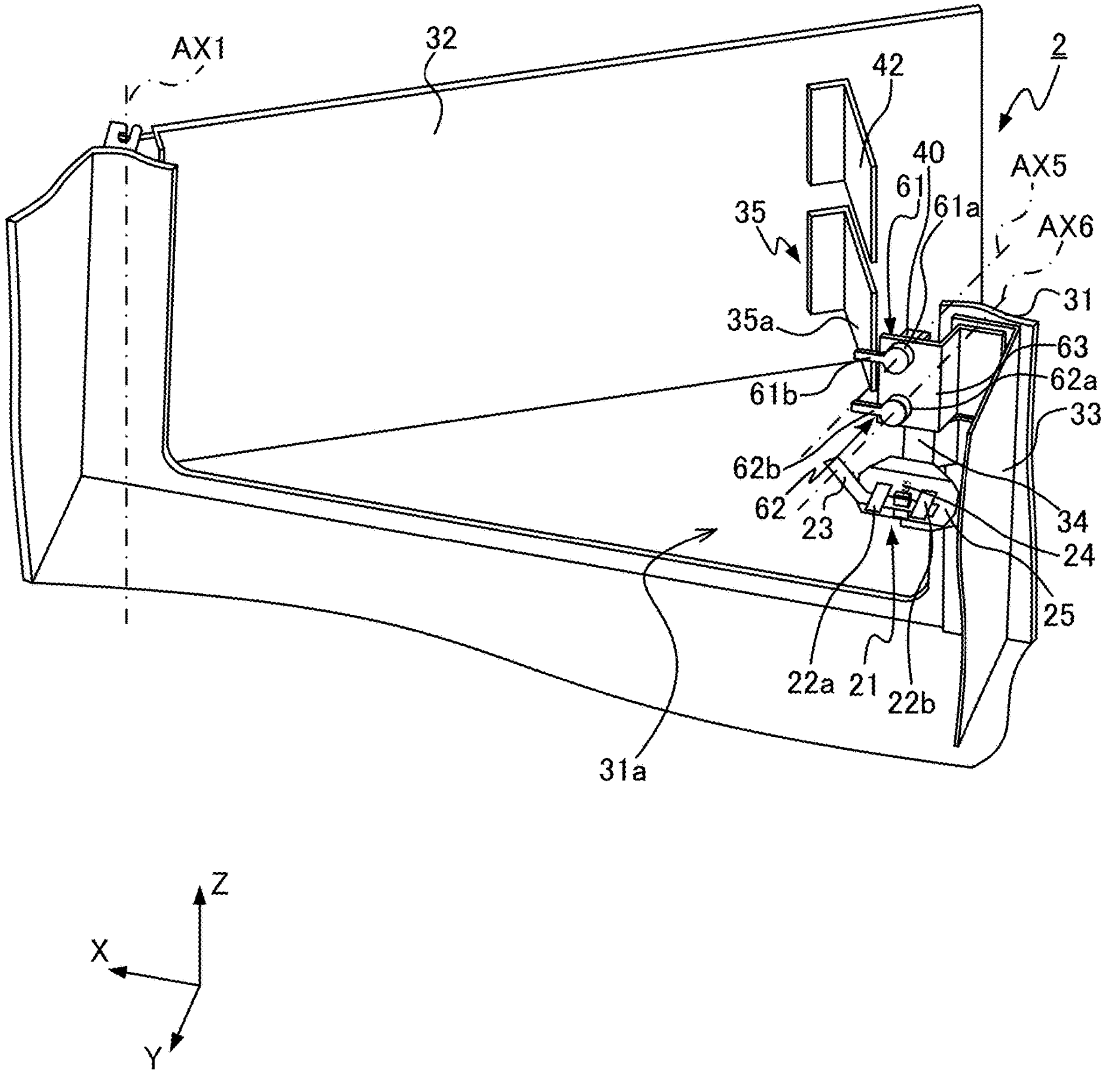
FIG. 14 is a diagram illustrating a modified example of a displacement limiting member, a discharge switch, and a key holder included in a second modified example of the electronic device according to the embodiment.

The structure of the interlock mechanism included in the electronic device 2 is not limited to the above examples. As an example, the electronic device 2 may suppress closing of the first cover 32 when the holding mechanisms 61*a* and 62*a* are positioned in the unlocked position by a member separate from the displacement limiting member 35. A modified example of the electronic device 2 including a protrusion member 42 separate from the displacement limiting member 35 is illustrated in FIG. 14.

The protrusion member 42 is attached to a side of the first cover 32 facing the interior of the housing 31 and has a shape extending in a direction away from the first cover 32. When an attempt is made to close the first cover 32 when the holding mechanisms 61*a* and 62*a* are positioned in the unlocked position, the protrusion member 42 attached to the first cover 32 comes in contact with the opening-closing limiting mechanisms 61*b* and 62*b* made of projections. This suppresses closing of the first cover 32. When the holding mechanisms 61*a* and 62*a* are positioned in the locked position, the protrusion member 42 attached to the first cover 32 does not come in contact with the opening-closing limiting mechanism 61*b* and 62*b* made of projections. This enables the first cover 32 to be closed. Here, it is sufficient that the displacement limiting member 35 has a shape that comes in contact with the movable member 23 and does not come in contact with the opening-closing limiting mechanisms 61*b* and 62*b*.

The orientation in which the electronic devices 1 and 2 are mounted on the railway vehicle may be any condition other than the above-mentioned examples. The electronic devices 1 and 2 may be installed in any movable body such as an automobile, an aircraft, or a vessel, rather than a railway vehicle, or installed at any stationary location.

The load device 91 is not limited to a three-phase induction motor, but rather may be a synchronous electric motor, or a DC electric motor. The load device 91 is not limited to a motor, but may be any device installed in the railway vehicle.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2 Electronic device
1*a*, 1*b* Input terminal
11 Power conversion circuit
12 Discharge circuit
21, 51 Discharge switch
22*a*, 22*b*, 52*a*, 52*b* Terminal
23, 53 Movable member
24, 54 Urging member
25, 55 Terminal holding member
26 Insulating member
31 Housing
31*a* First opening
31*b*, 31*c* Second opening
32 First cover
33 Fixed frame
34 Support member
35 Displacement limiting member
35*a* Contact portion
36, 37 Second cover
38, 39 Locking mechanism
40, 41 Key
42 Protrusion member
55*a*, 55*b*, 56*a*, 56*b* Attachment portion
56 Movable member holder
57 Extending-contracting mechanism
61, 62 Key holder
61*a*, 62*a* Holding mechanism
61*b*, 62*b* Opening-closing limiting mechanism
81 Cooling device
91 Load device
AX1, AX2, AX3, AX4, AX5, AX6 Rotation axis
C1 Capacitor
R1, R2 Discharge resistor
SW1 Switching element

The invention claimed is:

1. An electronic device, comprising:
a housing having a first opening and one or more second openings, the housing being configured to accommodate an electronic component and a discharge resistor for discharging the electronic component;
a discharge switch accommodated in the housing, the discharge switch including
a pair of terminals, one of the pair of terminals being electrically connected to the electronic component, the other of the pair of terminals being electrically connected to the discharge resistor, and
a movable member made of a conductor and positioned in a conductive position where the movable member is in contact with both of the pair of terminals or in a non-conductive position where the movable member is spaced apart from at least one of the pair of terminals;
a first cover being openable and closable and configured to cover the first opening;
a displacement limiting member that allows the movable member to be positioned in the conductive position when the first cover is opened and maintains the movable member in the non-conductive position when the first cover is closed,
one or more second covers being openable and closable and configured to cover the one or more second openings,
one or more locking mechanisms to lock the one or more second covers and allow a key to be removable only when the one or more second covers are locked, and
a key holder disposed inside the housing and configured to hold the key, wherein
the key holder includes
a holding mechanism positioned at either an unlocked position that allows insertion and removal of the key or a locked position that suppresses removal of the key inserted therein, and
an opening-closing limiting mechanism that suppresses closing of the first cover when the holding mechanism is position in the unlocked position and allows the first cover to be closed when the holding mechanism is positioned in the locked position, and
when the movable member of the discharge switch is positioned in the conductive position, the electronic component is electrically connected to the discharge resistor, and when the movable member of the discharge switch is positioned in the non-conductive position, the electronic component is electrically disconnected from the discharge resistor.

2. The electronic device according to claim 1, wherein
the displacement limiting member is attached to a side of the first cover facing an interior of the housing and has a contact portion having a plate-like shape and extending in a direction away from the first cover, and contact of the displacement limiting member with the movable member, with the first cover closed, maintains the movable member in the non-conductive position.

3. The electronic device according to claim 2, wherein
the movable member has an end fixed to one of the pair of terminals and has a shape revolvable around the fixed end.

4. The electronic device according to claim 2, wherein
the movable member has a shape to be fitted to both of the pair of terminals in the conductive position, and the movable member is spaced apart from both of the pair of terminals in the non-conductive position.

5. The electronic device according to claim 2, wherein
an insertion direction of the key to the holding mechanism matches a direction in which the first opening extends through,
the holding mechanism has a shape rotatable around a rotation axis extending in the insertion direction of the key, and
the opening-closing limiting mechanism is made of a projection attached to the holding mechanism and extending in a radial direction orthogonal to the rotation axis of the holding mechanism, the projection rotating as the holding mechanism rotates.

6. The electronic device according to claim 5, wherein upon the holding mechanism being positioned in the unlocked position, the displacement limiting member attached to the first cover comes in contact with the projection, thereby suppressing closing of the first cover.

7. The electronic device according to claim 5, further comprising:

a protrusion member attached to a side of the first cover facing an interior of the housing and extending in a direction away from the first cover, wherein upon the holding mechanism being positioned in the unlocked position, the projection comes in contact with the protrusion member, thereby suppressing closing of the first cover.

8. The electronic device according to claim 1, wherein the movable member has an end fixed to one of the pair of terminals and has a shape revolvable around the fixed end.

9. The electronic device according to claim 8, wherein the discharge switch further includes an urging member that urges the movable member to the conductive position.

10. The electronic device according to claim 9, wherein the urging member has an elastic body that deforms under external force and return to an original shape when the external force is removed, and the movable member is positioned in the conductive position when the elastic body has the original shape.

11. The electronic device according to claim 1, wherein the movable member has a shape to be fitted to both of the pair of terminals in the conductive position, and the movable member is spaced apart from both of the pair of terminals in the non-conductive position.

12. The electronic device according to claim 11, wherein the discharge switch further includes an urging member that urges the movable member to the conductive position.

13. The electronic device according to claim 12, wherein the urging member has an elastic body that deforms under external force and return to an original shape when the external force is removed, and the movable member is positioned in the conductive position when the elastic body has the original shape.

14. The electronic device according to claim 1, wherein the discharge switch further includes an urging member that urges the movable member to the conductive position.

15. The electronic device according to claim 2, wherein the discharge switch further includes an urging member that urges the movable member to the conductive position.

16. The electronic device according to claim 15, wherein the urging member has an elastic body that deforms under external force and return to an original shape when the external force is removed, and the movable member is positioned in the conductive position when the elastic body has the original shape.

17. The electronic device according to claim 14, wherein the urging member has an elastic body that deforms under external force and return to an original shape when the external force is removed, and the movable member is positioned in the conductive position when the elastic body has the original shape.

18. The electronic device according to claim 1, wherein an insertion direction of the key to the holding mechanism matches a direction in which the first opening extends through, the holding mechanism has a shape rotatable around a rotation axis extending in the insertion direction of the key, and the opening-closing limiting mechanism is made of a projection attached to the holding mechanism and extending in a radial direction orthogonal to the rotation axis of the holding mechanism, the projection rotating as the holding mechanism rotates.

19. The electronic device according to claim 18, wherein upon the holding mechanism being positioned in the unlocked position, the displacement limiting member attached to the first cover comes in contact with the projection, thereby suppressing closing of the first cover.

20. The electronic device according to claim 18, further comprising:

a protrusion member attached to a side of the first cover facing an interior of the housing and extending in a direction away from the first cover, wherein upon the holding mechanism being positioned in the unlocked position, the projection comes in contact with the protrusion member, thereby suppressing closing of the first cover.

* * * * *